United States Patent [19]

Grunfeld

[11] Patent Number: 5,033,404
[45] Date of Patent: Jul. 23, 1991

[54] BARRIER MECHANISM FOR ISOLATING DRIVE CHAIN FROM ACTIVE CHAMBER IN LANGMUIR TROUGH

[75] Inventor: Frank A. Grunfeld, Kenilworth, England

[73] Assignee: Nima Technology Ltd., Coventry, England

[21] Appl. No.: 540,452

[22] Filed: Jun. 19, 1990

Related U.S. Application Data

[63] Continuation of Ser. No. 262,989, Oct. 26, 1988, abandoned.

[51] Int. Cl.⁵ .............................................. B05C 3/00
[52] U.S. Cl. ................................. 118/403; 427/434.3
[58] Field of Search .................... 427/434.3; 118/402, 118/403

[56] References Cited

U.S. PATENT DOCUMENTS

| | | | |
|---|---|---|---|
| 2,615,821 | 10/1952 | Levy | 117/33.5 |
| 3,440,530 | 4/1969 | Reich et al. | 324/62 |
| 3,678,891 | 7/1972 | Rosenberg | 118/402 |
| 3,731,808 | 5/1973 | Rickert | 210/138 |
| 3,918,149 | 11/1975 | Roberts | 29/580 |
| 3,974,413 | 8/1976 | Craig | 313/222 |
| 3,995,190 | 11/1976 | Salgo | 313/391 |
| 4,006,404 | 2/1977 | Szuszczewicz et al. | 324/33 |
| 4,090,253 | 5/1978 | Salgo | 365/128 |
| 4,093,757 | 6/1978 | Barraud et al. | 427/434 |
| 4,204,865 | 5/1980 | Kuehnle et al. | 430/30 |
| 4,317,043 | 2/1982 | Rosenbluth et al. | 250/510 |
| 4,511,604 | 4/1985 | Barraud et al. | 427/402 |
| 4,534,015 | 8/1985 | Wilson | 365/106 |
| 4,554,076 | 11/1985 | Speaker | 210/639 |
| 4,584,235 | 4/1986 | Roberts et al. | 428/333 |
| 4,632,800 | 12/1986 | Barraud et al. | 264/298 |
| 4,643,125 | 2/1987 | Barlow et al. | 118/402 |
| 4,645,693 | 2/1987 | Roberts et al. | 427/402 |
| 4,646,678 | 3/1987 | Grunfeld | 118/667 |
| 4,659,177 | 4/1987 | Choe et al. | 350/96.34 |
| 4,690,857 | 9/1987 | Shirahata et al. | 428/216 |
| 4,696,838 | 9/1987 | Miyata et al. | 427/407 |
| 4,703,220 | 10/1987 | Walsh | 313/112 |
| 4,722,856 | 2/1988 | Albrecht et al. | 427/402 |
| 4,728,576 | 3/1988 | Gillberg-LaForce et al. | 428/411.1 |

FOREIGN PATENT DOCUMENTS

| | | | |
|---|---|---|---|
| 0145585 | 6/1985 | European Pat. Off. | 118/402 |
| 60-223117 | 11/1985 | Japan . | |
| 60-225635 | 11/1985 | Japan . | |
| 60-227829 | 11/1985 | Japan . | |

OTHER PUBLICATIONS

Article—"An Automatic Trough to Make Alternate Layers", Baraud, et al., *Thin Solid Films*, 133 (1985) 117-123; 8/16/85.

Article—"An Applied Science Perspective of Langmuir-Blodgett Films" by G. G. Roberts; *Advances in Physics*, vol. 34, No. 4, 475-512, (2 May 1985).

Article—"73-Spectroscopy", *Chemical Abstracts*, vol. 101, 1984.

Nima Technology sales literature, "Thin Film Balances for the Analysis and Fabrication of Mono and Multi--Molecular Layers". (1985).

*Primary Examiner*—Bernard Nozick
*Attorney, Agent, or Firm*—Kramer, Brufsky & Cifelli

[57] ABSTRACT

A barrier mechanism for isolating a drive chain from an active chamber in a Langmuir trough is provided. The chain drives a substrate mounted on a backing plate through the active chamber in order to coat the substrate. The chain passes through a "C" shaped barrier adjacent to the active chamber. The barrier mechanism comprises a resilient strip biased by a leaf spring to seal a side opening in the barrier. A wedge is mounted to the backing plate to open the resilient strip and leaf spring and thereby permit the backing plate to pass through the side opening as the substrate is driven into the active chamber.

22 Claims, 4 Drawing Sheets

BARRIER MECHANISM FOR ISOLATING DRIVE CHAIN FROM ACTIVE CHAMBER IN LANGMUIR TROUGH

This application is a continuation of application Ser. No. 07/262,989, filed Oct. 26, 1988 now abandoned.

BACKGROUND OF THE INVENTION

The invention relates generally to Langmuir troughs which are used to deposit monomolecular layers of fatty acids and the like on substrates, and deals more particularly with a barrier mechanism for isolating a drive chain from an active chamber in such a Langmuir trough to prevent contamination of the active chamber.

A basic procedure for the deposition of a monomolecular layer of fatty acid on a substrate was originally developed by Dr. Irving Langmuir. According to this procedure, a monomolecular layer was spread on the surface of water in a trough, and then compressed by a movable barrier supported at the height of the layer. This movement of the barrier also aligned the molecules such that a hydrophilic end of each molecule was oriented adjacent to the water surface and a hydrophobic end of each molecule was oriented above and out of the water. Then, a substrate, typically positioned in a vertical plane, was lowered into the water through the monomolecular layer and, in the process thereof, coated with the monomolecular layer. If this process was repeated, or if the substrate was subsequently raised out of the water through the monomolecular layer, another layer was deposited on the substrate over the first layer. Alternately, the substrate could initially be positioned in the water before the monomolecular layer was spread on the water's surface, and then the substrate raised out of the water to deposit a single monomolecular layer on the substrate.

The coated substrates have various applications. For example, if the substrate is a semi-conductor wafer and the molecules are cross linkable upon exposure to ultraviolet light, the monomolecular layer or layers on the wafer can be hardened by exposure to ultraviolet light and used to form masks to define an etching pattern on the wafer. In another application, the monomolecular layer or layers can be hardened and to form a dielectric of precise thickness in electronic components. In still another application, multilayer films having nonlinear optical properties can be obtained by appropriate alternation or other sequencing of films having an optically active chromophore and another film that does not. Multilayers of this type may possess second harmonic generation properties.

It was also previously known to provide a Langmuir trough divided into two active chambers by a lock, and to deposit layers of different molecules on the surface of water in each chamber. Then, the molecules on the surface of the water in each chamber were compressed, and a substrate lowered into one chamber, moved laterally beneath the water surface through the lock into the other chamber, and then raised out of this other chamber. The result was the deposition of two different or alternating layers on the substrate.

It was also previously known to divide a Langmuir trough into two active chambers by a fixed central barrier supported at the surface of the water in the chambers. A monomolecular layer of one type was deposited on the surface of the water in one chamber and a monomolecular layer of another type was deposited on the surface of the water in the other chamber, and both layers were compressed. A chain driven substrate was then circulated downwardly into one chamber through the respective monomolecular layer, arcuately passed underneath the central barrier, and finally passed upwardly through the other chamber and the other monomolecular layer to provide two alternate monomolecular layers on the substrate. However, a potential problem has developed in this technique because the chain can possibly transport molecules of one type from one chamber into the other chamber and thereby contaminate the other chamber.

Accordingly, a general object of the present invention is to provide a barrier mechanism to isolate the drive chain in the aforesaid system from one or both of the chambers to prevent molecules of one type from one chamber from being carried by the chain into the other chamber.

Another general object of the present invention is to provide a barrier mechanism to isolate a drive chain or the like from an active chamber in other types of Langmuir troughs.

Another, more specific object of the present invention is to provide a barrier mechanism of the foregoing type which does not interfere with the movement of the substrate or the associated chain.

SUMMARY OF THE INVENTION

The present invention resides in an improvement to an apparatus for depositing one or more molecular layers on a substrate. The apparatus includes a trough having an active chamber adapted to receive a fluid subphase and a molecular layer floating on the surface of the fluid subphase; a first barrier fixedly located at the surface of the fluid subphase and forming a partial border of the active chamber; and a second barrier adjoining the first barrier, supported at the surface of the fluid subphase and shaped as a partial enclosure for a surface region of the fluid subphase outside of the active chamber. The apparatus further comprises a chain; means for driving the chain through the partially enclosed region within the second barrier and through the fluid subphase beneath the partially enclosed region; and support means, mounted for movement with the chain through a side opening in the second barrier and through the fluid subphase beneath the side opening, for supporting a portion of a substrate to be coated and moving the substrate portion with the chain. The portion of the substrate to be coated moves through the molecular layer and the fluid medium in the active chamber. The support means has a rear surface which slidably engages the first barrier as the support means moves through the side opening in the second barrier.

The improvement effected through the present invention isolates the chain from the active chamber and comprises a resilient strip supported at the level of the fluid medium in blocking relation to the side opening in the second barrier. The resilient strip has a free end adjacent to the first barrier. The improvement also comprises a leaf spring supported against the resilient strip to bias the resilient strip toward the first barrier. Consequently, when the support means is not positioned within the side opening, the resilient strip is biased against the first barrier to prevent the molecular layer within the active chamber from spreading into the partially enclosed region within the second barrier. Also, when the support means moves through the side opening, the resilient strip separates from the first barrier but is biased toward a front surface of the support means to prevent the molecular layer within the active chamber from spreading into the partially enclosed region within the second barrier.

In accordance with one feature of the present invention, the improvement further comprises a wedge mounted in fixed relation to the support means to facilitate the separation of the resilient strip from the central barrier and the passage of the support means through the side opening. The wedge has a leading edge to make initial contact with the resilient strip, a flat surface positioned to slidably engage the first barrier when the support means moves through the side opening in the second barrier, and an inclined surface which forms the edge with the flat surface to separate the resilient strip from the first barrier when the support means moves through the side opening.

DETAILED DESCRIPTION OF THE PREFERRED EMBODIMENTS

Figure 1:
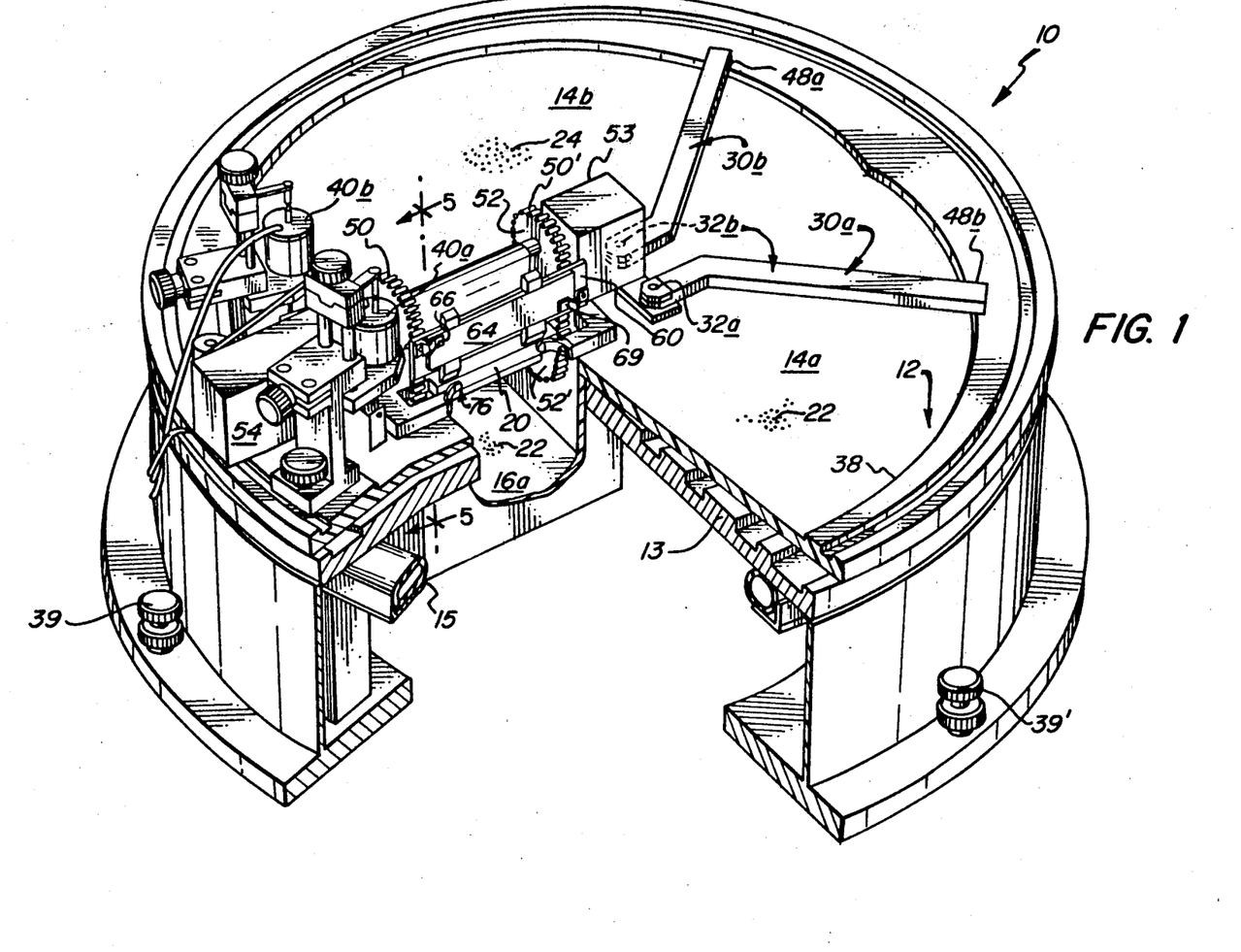
FIG. 1 is a perspective view of a Langmuir trough with portions broken away to reveal two active chambers therein, and a barrier mechanism for isolating a drive chain from each active chamber, which barrier mechanism embodies the present invention.
Figure 5:
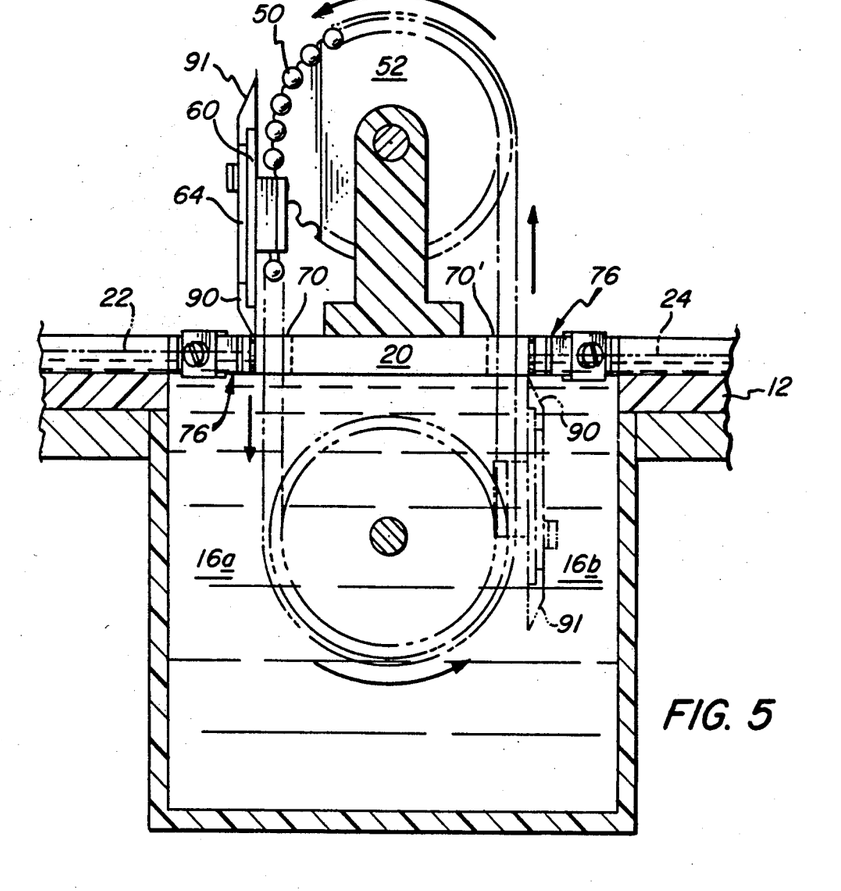
FIG. 5 is a side view in cross-section taken along the plane indicated by line 5—5 of FIG. 1, and shows the circulation of a substrate by the drive chain with the substrate shown in one position in solid line and, in another, subsequent position, in broken line.

Referring now to the Figures in detail wherein like reference numerals indicate like elements throughout the several views, FIG. 1 illustrates a Langmuir trough assembly generally designated 10 in accordance with the present invention. The assembly 10 comprises a circular trough 12 having relatively shallow reserve chambers 14a and 14b and relatively deep active chambers 16a and 16b (chamber 16b is shown in FIG. 5). During operation, the trough is filled with water or other fluid subphase to the level of a rim 38. Preferably, the trough is made of a fluorocarbon resin such as polytetrafluoroethylene sold under the trademark "Teflon" by E. I. duPont de Nemours of Wilmington, Del., which resin will not contaminate the fluid subphase. FIG. 1 further illustrates a support frame 13 for trough 12, leveling screws 39, 39', and a pneumatic vibration mount 15 for frame 13.

Active chambers 16a and 16b are separated by a fixed central barrier 20 which is supported at the level of the water. Because central barrier 20 does not extend to the bottom of trough 12, chambers 14a, 14b, 16a and 16b communicate with each other beneath barrier 20 with respect to the fluid subphase. Central barrier 20 isolates a monomolecular layer 22 floating on the fluid subphase in chambers 14a and 16a from a monomolecular layer 24 floating on the fluid subphase in chambers 14b and 16b.

Assembly 10 further comprises movable barriers 30a and 30b which are also supported at the level of the fluid subphase, and separate reserve chamber 14a from reserve chamber 14b. The movable barriers are used to compress the respective monomolecular layers by pivotal movement toward central barrier 20 about respective pivot axes 32a and 32b. Depending ends 48a and 48b of the movable barrier slide along the top surface of rim 38. Consequently, the molecules are confined to the fluid subphase surface between central barrier 20, rim 38 and the respective movable barrier 30a and 30b.

Assembly 10 further includes sensors 40a and 40b which measure the surface tension on each side of the central barrier in order to control the movement of the barriers 30a and 30b to maintain a constant surface tension during operation of assembly 10. U.S. Pat. No. 4,646,678 to Grunfeld illustrates a circular trough and pivotable barrier which are similar in some respects to trough 12 and barrier 30a of the present invention. This patent is hereby incorporated by reference as part of the present disclosure to provide further details of the design and operation of such a trough and barrier system.

As further illustrated in FIG. 1, chains 50, 50' are entrained around sprockets 52, 52' and driven by a drive motor and gearbox 54 through the fluid subphase adjacent to chambers 16a and 16b at opposite sides thereof. Thus, as described in more detail below, care must be taken to prevent the chains from contaminating the active chambers. A sensor within housing 53 measures the angular position of sprockets 52, 52' and feeds back the position data to a microprocessor (not shown), which microprocessor controls the chain drive motor. A backing plate 60 is clamped at opposite sides to chains 50, 50' and thus, circulates downwardly into chamber 16a arcuately underneath central barrier 20, and then upwardly out of chamber 16b. A substrate 64 is clamped to backing plate 60 by clamps 66 and 69. Consequently, during each complete cycle of chains 50, 50', substrate 64 passes downwardly through monomolecular layer 22 on the surface of the fluid subphase in active chamber 16a and upwardly through monomolecular layer 24 on the surface of the fluid subphase in active chamber 16b and is thereby coated with two different monomolecular layers. However, it should be understood that the present invention as described below is also useful in troughs which contain only one active chamber and one chain, to isolate the chain from the active chamber. Also, the direction of the dipping motion can be reversed or an oscillatory motion implemented through one active chamber. Also, the shape of the substrate can vary.

Figure 2:
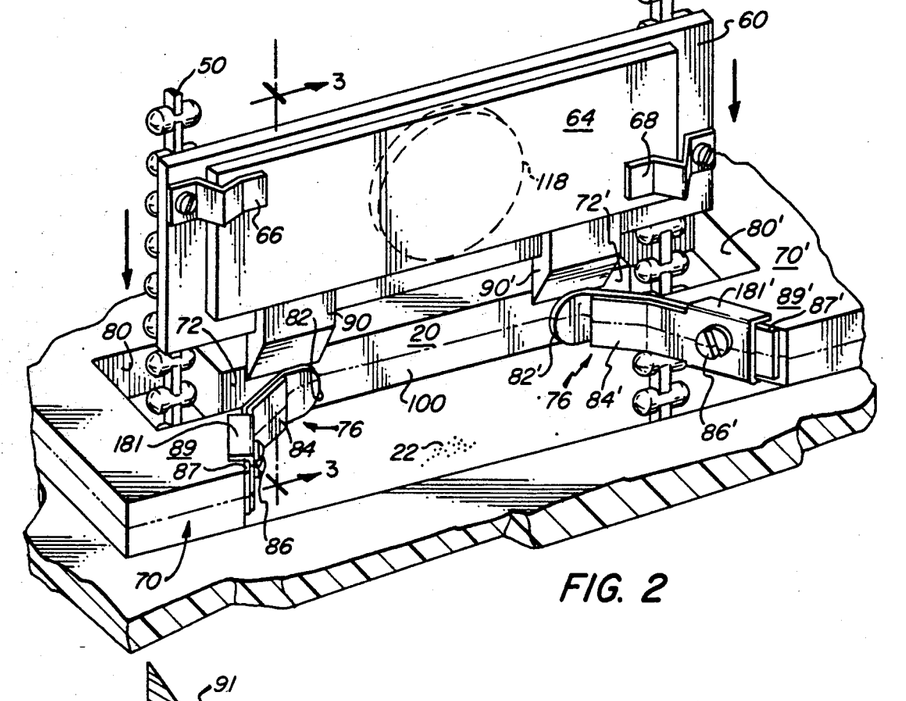
FIG. 2 is a fragmentary, enlarged perspective view of the barrier mechanism of FIG. 1.

Focusing now on the present invention as illustrated in more detail in FIG. 2, fixed side barriers 70, 70' are provided integral with central barrier 20 and supported at the level of the fluid subphase within the trough. Each side barrier 70, 70' is "C" shaped and forms a chain chamber 80 or 80' which surrounds the respective chain 50, 50' except for slots 72, 72'. The slots permit backing plate 60 and optionally substrate 64 to pass therethrough enroute to chamber 16a. Side barriers 70, 70' are preferably made of a fluorocarbon resin such as polytetrafluoroethylene sold under the trademark Teflon by E. I. duPont de Nemours, and to the extent they surround chain 50, 50', prevent the molecules 22 from spreading to chains 50, 50'. Barrier mechanisms 76, 76' prevent molecules 22 from entering into the chain chambers through slots 72, 72'. Barrier mechanisms 76, 76' include resilient strips 82, 82' which are preferably made of Teflon, and resilient, but stiffer leaf springs 84, 84' which springs are preferably made of stainless steel. By way of example, resilient strip 82 is made of fluorinated ethylene propylene resin (available from E. I. duPont de Nemours under the trademark Teflon) or other fluorocarbon resin 11 thousandths of an inch thick, and leaf spring 84 is 2.5 thousandths of an inch thick. Screws 86, 86' and brackets 181, 181' secure leaf springs 84, 84' and Teflon strips 82, 82' to an inclined surface 87, 87' of a forward leg 89, 89' of side barrier 70, 70'. The natural resiliency of strip 82 and the leaf spring 84 biases strip 82 against a front face 100 of central barrier 20. In such an orientation, strip 82 seals slot 72 in side barrier 70 against intrusion by molecules 22 on the surface of the fluid subphase in active chamber 16a. Preferably, the fluid subphase level is approximately halfway up strip 82 and spring 84.

Figure 3:
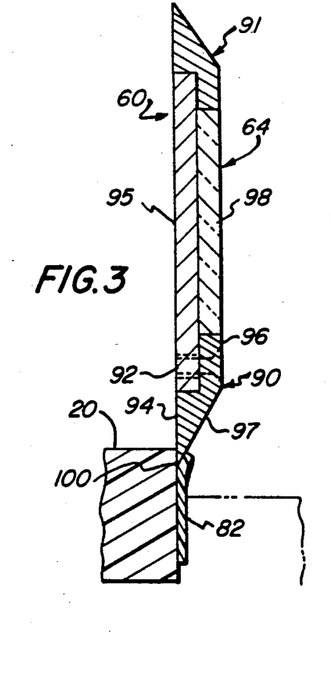
FIG. 3 is a side view in cross-section of the barrier mechanism taken along the plane indicated by line 3—3 of FIG. 2.

As illustrated in FIGS. 2 and 3, barrier mechanism 76 further comprises a wedge 90 which is mounted to backing plate 60 beneath substrate 64 by a recessed screw 92. As shown in FIGS. 1 and 3, barrier mechanism 76 further comprises an identical wedge 91 which is mounted to backing plate 60 above substrate 64 by a recessed screw (not shown). A rear face 94 of wedge 90 is flush with a rear face 95 of backing plate 60 and a front, parallel face 96 of wedge 90 is flush with a front face 98 of substrate 64. Rear face 94 is also nearly aligned with a front face of central barrier 20 such that when backing plate 60 is moved downwardly by chains 50, 50' and a leading edge 100 of wedge 90 is located at the level of central barrier 20, rear face 94 is essentially sealed with central barrier 20 so that molecules 22 cannot pass between wedge 90 and central barrier 20.

Figure 4:
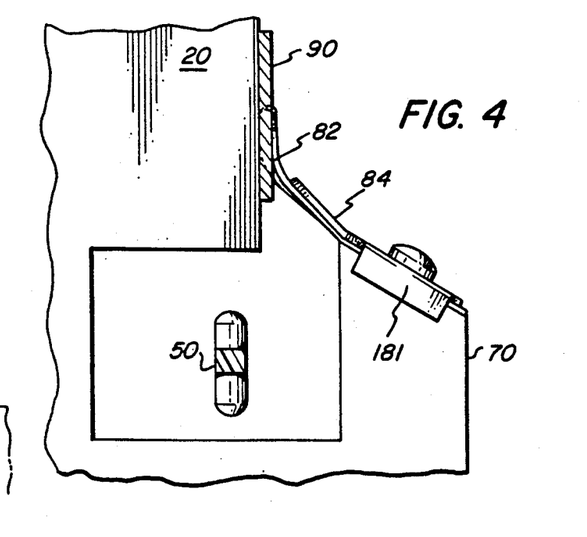
FIG. 4 is a partial, top view in cross-section taken along the plane through the barrier mechanism of FIG. 2.

When backing plate 60 is lowered still further, leading edge 100 separates the top of resilient strip 82 from central barrier 20 as best illustrated in FIG. 3. As illustrated in FIG. 2, the free end of resilient strip 82 is rounded to prevent wedge 90 from catching the strip. In the orientation of FIG. 3, the top portion of resilient strip 82 conforms to the shape of wedge 90 so that molecules 22 cannot pass between resilient strip 82 and wedge 90. The bias of spring 84 (shown in FIG. 4 but not shown in FIG. 3) helps to maintain the top portion of resilient strip 82 against the inclined surface of wedge 90 and the lower portion of resilient strip 82 against central barrier 20.

As backing plate 60 is driven further downwardly by chains 50, 50', resilient strip 82 is further separated from central barrier 20 but sealed with the inclined surface of wedge 90 to maintain the seal over slot 72. When backing plate 60 is further lowered until surface 96 of wedge 90 is positioned between resilient strip 82 and central barrier 20, resilient strip 72 is biased against surface 96 while rear surface 95 of backing plate 60 is sealed with central barrier 20. As backing plate 60 is lowered still further, resilient strip 82 slides smoothly from surface 96 of wedge 90 to front surface 98 of substrate 64 and a seal is maintained with substrate 64. When the upper sides of substrate 64 and backing plate 60 pass behind resilient strip 82 and spring 84, resilient strip 82 is biased against wedge 91 and thereby maintains a seal over slot 72 in a manner analogous to the interaction with wedge 90 described above.

FIG. 5 illustrates the passage of substrate 64 downwardly into chamber 16a through the layer of molecules 22 and the fluid subphase below, arcuately into chamber 16b, and upwardly out of chamber 16b through the fluid subphase and layer of molecules 24. During the circulation, a first layer of molecules 22 is deposited on the surface of substrate 64 and then a second, different layer of molecules 24 is deposited over the layer of molecules 22. Meanwhile, chains 50, 50' are driven through respective chain chambers 80, 80' in side barriers 70, 70' adjacent to chambers 16a and 16b without coming into contact with either molecular layers 22 or 24 so that the chains do not transport molecules 22 into active chamber 16b and also do not transport molecules 24 into active chamber 16a. This satisfies the principle object of the present invention.

Figures 6, 7:
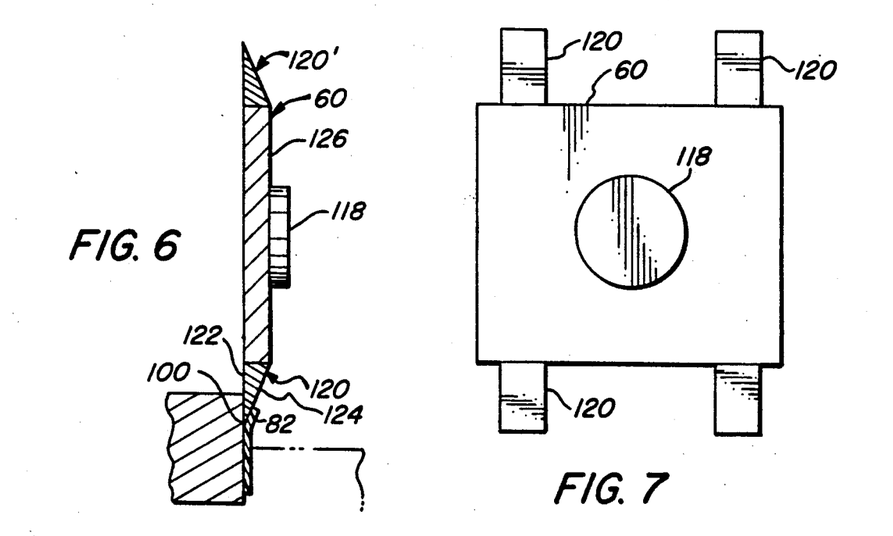
FIG. 6 is a side view in cross-section taken along a vertical plane of a substrate backing plate, a pair of separator wedges and a resilient strip in accordance with another embodiment of the present invention, and is shown in the position of the barrier mechanism of FIG. 3.
FIG. 7 is a front elevational view of the substrate backing plate and the pair of separator wedges of FIG. 6.

Based on the foregoing, a barrier mechanism comprising the present invention has been disclosed in conjunction with one type of suitable trough. However, numerous modifications and substitutions may be made to the barrier mechanism or trough without deviating from the scope of the present invention. For example, if desired, a round semiconductor wafer 118 illustrated in broken line in FIG. 2 with a diameter less than the distance between strips 82, 82, can be mounted on "substrate 64" for coating instead of substrate 64. Alternately, the wafer 118 can be mounted directly on backing plate 60 as illustrated in FIGS. 6 and 7, and wedges 120, 120' provided, which wedges depend entirely below or above backing plate 60. A rear surface 122 of wedge 120 is nearly aligned with front face 100 of central barrier 20 to form a seal therebetween and one edge of an inclined surface 124 of wedge 120 meets a front surface 126 of backing plate 60. This configuration advantageously provides a relatively small angle of inclination of surface 124 (compared to inclined surface 97) so that the seal between resilient strip 82 and inclined surface 124 is more readily obtained and resilient strip 82 is subject to a lesser deflection and therefore lesser wear.

Figures 8, 10:
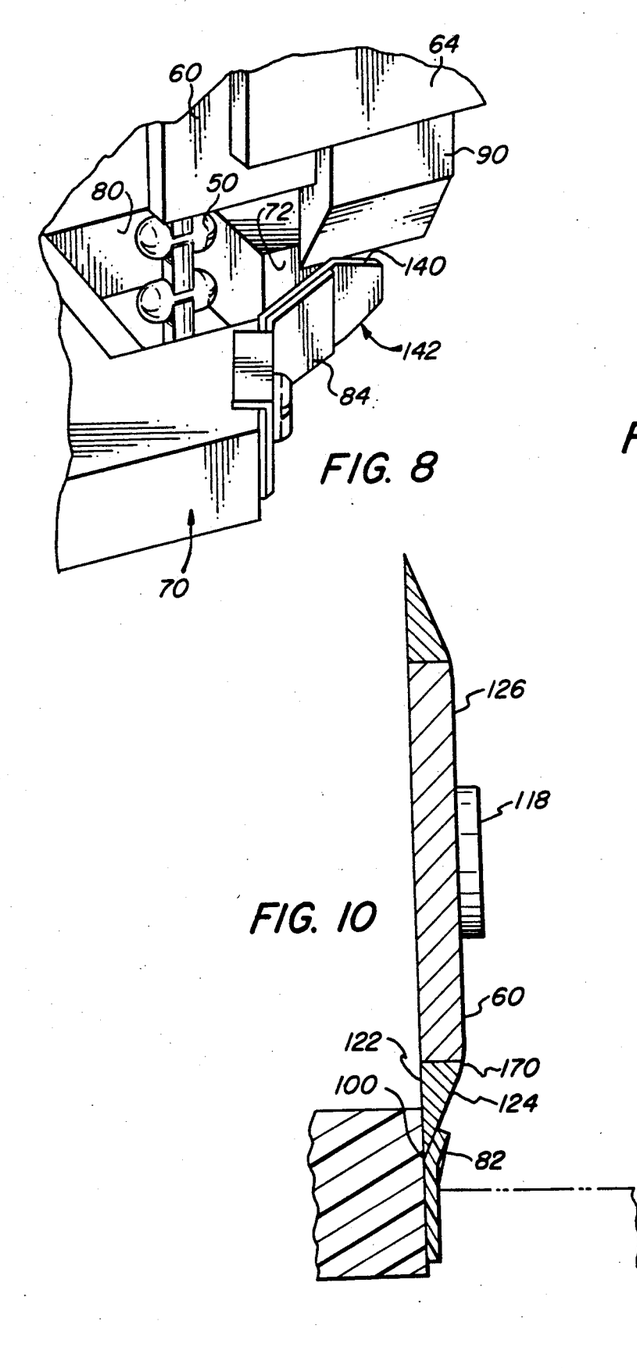
FIG. 8 is a fragmentary perspective view of a barrier mechanism in accordance with still another embodiment of the present invention.
FIG. 10 is a side view in cross-section taken along a vertical plane of a substrate backing plate, a pair of separator wedges in accordance with still yet another embodiment of the present invention, and a resilient strip, and is shown in the position of the barrier mechanism of FIG. 3.

Also, in still another embodiment of the present invention, exposed edges 140, 140 of a resilient strip 142 have a tapered shape as illustrated in FIG. 8 instead of the circular shape illustrated in FIG. 2. In this other embodiment, the leading edge of the wedge 90 preferably makes initial contact with the upper tapered edge 140 of the resilient strip 142.

Figure 9:
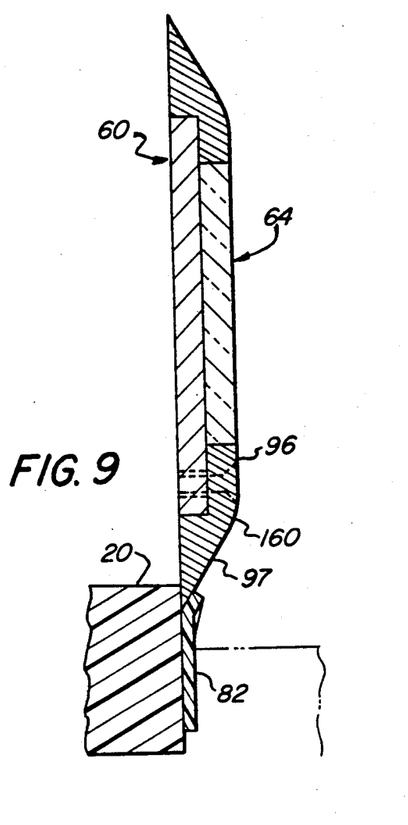
FIG. 9 is a side view in cross-section taken along a vertical plane of a substrate backing plate, a substrate, a pair of separator wedges in accordance with yet another embodiment of the present invention, and a resilient strip, and is shown in the position of the barrier mechanism of FIG. 3.

Also, if desired, a single chain 50 can be used to drive the backing plate and substrate, with the substrate being cantilevered from the chain. Also, if desired to improve the seal between either resilient strip 82, 82' or 142 and the wedge, the wedge can have a rounded surface or juncture 160 between inclined surface 97 and front surface 96 as illustrated in FIG. 9, or a rounded surface or juncture 170 between inclined surface 124 and front surface 126 of backing plate 60 as illustrated in FIG. 10. Also, if desired, an additional relatively stiff leaf spring or small plate can be installed between each bracket 86, 86' and the respective leaf spring 84, 84'. Each of the relatively stiff leaf springs or plates would protrude ⅛ to ¼ of an inch out from the bracket toward the free end of the leaf spring 84 or 84' to provide additional support for the leaf spring 84 or 84' and the resilient strip 82 or 82'. Therefore, the invention has been disclosed by way of illustration and not limitation, and reference should be made to the following claims to determine the scope of the invention.

I claim:

1. In an apparatus for depositing one or more molecular layers on a substrate, said apparatus comprising:
   a trough having an active chamber adapted to receive a fluid subphase and first and second reserve chambers adapted to receive at least one molecular layer floating on the surface of said fluid subphase in said active chamber;
   a first barrier in said trough fixedly located at the surface of said fluid subphase and forming a partial border to isolate said first and second reserve chambers;
   a second barrier in said trough adjoining said first barrier and supported at the surface of said fluid subphase forming a partial border to isolate said first and second reserve chambers, said second barrier having a chain chamber enclosing a surface region of said fluid subphase outside of said first and second reserve chambers;
   a movable barrier in said trough for forming a partial border of said first and second reserve chambers whereby said first and second barriers and said movable barrier together with said trough isolate said first and second reserve chambers from each other;
   an endless chain supported on sprockets above said trough adjacent to said chain chamber in said second barrier;
   means for driving said sprockets to move said chain through said chain chamber within said second barrier and through the fluid subphase beneath said chain chamber;
   support means being connected to said chain for movement with said chain through said chain chamber and through the fluid subphase beneath said chain chamber, said support means supporting a portion of a substrate and moving said portion of said substrate through said at least one molecular layer and said fluid subphase in said active chamber, said support means having a rear surface which slidably engages said first barrier as said support means moves through said chain chamber in said second barrier;
   a resilient strip connected to said second barrier at the level of said fluid subphase in blocking relation to said chain chamber in said second barrier, said resilient strip having a free end adjacent to said first barrier; and
   a leaf spring mounted at one end to said second barrier and disposed against said resilient strip to bias said resilient strip toward said first barrier, such that when said support means is not positioned within said chain chamber, said resilient strip is biased against said first barrier to prevent said at least one molecular layer within said first reserve chamber from spreading into said chain chamber of said second barrier, and when said support means moves through said chain chamber, said resilient strip separates from said first barrier and is biased against a front surface of said support means to prevent said at least one molecular layer within said first reserve chamber from spreading into said chain chamber within said second barrier.

2. An apparatus as set forth in claim 1 wherein said support means comprises a plate and clamp means for clamping said substrate to said plate.

3. An apparatus as set forth in claim 1 wherein said resilient strip is made of a fluorocarbon resin and said leaf spring is made of stainless steel.

4. An apparatus as set forth in claim 1 wherein said free end of said resilient strip is tapered to facilitate the separation of said resilient strip from said first barrier when said support means moves through said chain chamber.

5. An apparatus as set forth in claim 1 wherein said first barrier has a front, flat surface and said support means has a rear surface which slidably engages said front surface to form a seal.

6. An apparatus as set forth in claim 5 wherein said second barrier is generally "C" shaped and forms a chain chamber opening adjacent to said front surface of said first barrier; and
   said resilient strip and said leaf spring are attached to said second barrier forwardly of said front surface of said first barrier.

7. An apparatus as set forth in claim 6 wherein said front surface of said first barrier is located in a generally vertical plane, a portion of said resilient strip biased against said flat surface is located in a generally vertical plane, and a portion of said leaf spring biased against said resilient strip is located in a generally vertical plane.

8. An apparatus as set forth in claim 1 wherein said free end of said resilient strip is rounded to facilitate the separation of said resilient strip from said first barrier when said support means moves through said chain chamber.

9. An apparatus as set forth in claim 8 wherein said leaf spring has a first end attached to said second barrier and a second, free end biased toward said first barrier, said free end terminating before said rounded end of said resilient strip.

10. An apparatus as set forth in claim 1 further comprising:
    a wedge, mounted in fixed relation to said support means, having a leading edge to make initial contact with said resilient strip, said wedge having a flat surface positioned to slidably engage said first barrier when said support means moves through said chain chamber in said second barrier, and having an inclined surface which forms said edge with said flat surface to separate said resilient strip from said first barrier when said support means moves through said chain chamber.

11. An apparatus as set forth in claim 10 wherein said rear surface of said wedge is flush with a rear surface of said support means.

12. An apparatus as set forth in claim 11 wherein said support means comprises a plate adapted to have said substrate mounted thereto whereby the front surface of said substrate can be coated; and
- a portion of said wedge opposite said leading edge is flush with said front surface of said substrate.

13. In an apparatus for depositing one or more molecular layers on a substrate, said apparatus comprising:
- a trough having an active chamber adapted to receive a fluid subphase and first and second reserve chambers adapted to receive at least one molecular layer floating on the surface of said fluid subphase in said active chamber;
- a first barrier in said trough fixedly located at the surface of said fluid subphase and forming a partial border to isolate said first and second reserve chambers;
- a second barrier in said trough adjoining said first barrier and supported at the surface of said fluid subphase forming a partial border to isolate said first and second reserve chambers, said second barrier having a chain chamber enclosing a surface region of said fluid subphase outside of said first and second reserve chambers;
- a movable barrier in said trough for forming a partial border of said first and second reserve chambers whereby said first and second barrier and said movable barrier together with said trough isolate said first and second reserve chambers from each other;
- an endless chain supported on sprockets above said trough adjacent to said chain chamber in said second barrier;
- means for driving said sprockets to move said chain through said chain chamber within said second barrier and through the fluid subphase beneath said chain chamber;
- support means being connected to said chain for movement with said chain through said chain chamber and through the fluid subphase beneath said chain chamber, said support means supporting a portion of a substrate and for moving said portion of said substrate through said at least one molecular layer and said fluid subphase in said active chamber, said support means having a rear surface which slidably engages said first barrier as said support means moves through said chain chamber in said second barrier;
- a resilient strip connected to said second barrier at the level of the fluid subphase in blocking relation to said chain chamber in said second barrier, said resilient strip having a free end adjacent to said first barrier and being biased against said first barrier when said support means is not positioned within said chain chamber to prevent said at least one molecular layer within said first reserve chamber from spreading into said chain chamber of said second barrier; and
- a wedge mounted in fixed relation to said support means, said wedge having a leading edge which is aligned with said resilient strip to make initial contact with said resilient strip, said wedge having a flat surface which slideably engages said first barrier when said support means moves through said chain chamber, said wedge further having an inclined surface forming said leading edge with said flat surface to separate said resilient strip from said first barrier and seal with said resilient strip when said support means approaches said chain chamber.

14. An apparatus as set forth in claim 13 wherein said rear surface of said wedge is flush with said rear surface of said support means.

15. An apparatus as set forth in claim 14 wherein said support means comprises a plate and said rear surface of said wedge is aligned with the rear surface of said plate.

16. An apparatus as set forth in claim 15 wherein a side of said inclined surface opposite said leading edge is flush with a front surface of said plate.

17. An apparatus as set forth in claim 16 wherein the side of said inclined surface of said wedge opposite said leading edge smoothly curves from said front surface of said plate to said inclined surface of said wedge, whereby the seal with said resilient strip is facilitated when said resilient strip engages said side of said inclined surface.

18. An apparatus as set forth in claim 14 wherein said support means comprises a plate, said substrate has a front surface to be coated, and a portion of said wedge opposite said edge is flush with said front surface of said substrate.

19. An apparatus as set forth in claim 18 wherein said wedge has a surface parallel to said rear surface adjacent to said inclined surface and opposite said leading edge, which parallel surface is flush with said front surface of said substrate.

20. An apparatus as set forth in claim 18 wherein said wedge has a surface opposite to said rear surface, adjacent to said inclined surface and opposite to said edge, one side of said opposite surface being flush with said front surface of said substrate and the other side of said opposite surface smoothly curving to be flush with said inclined surface, whereby the seal with said resilient strip is facilitated when said resilient strip engages said opposite surface.

21. In an apparatus for depositing one or more molecular layers on a substrate, said apparatus comprising:
- a trough having a wall and a chamber within said wall adapted to receive a fluid subphase and a first and second trough section each adapted to receive at least one molecular layer floating on the surface of said fluid subphase in said chamber;
- a first barrier in said trough fixedly located at the surface of said fluid subphase and forming a partial border to isolate said first and second trough sections;
- a second barrier in said trough adjoining said first barrier supported at the surface of said fluid subphase forming a partial border with said first barrier to isolate said first and second trough sections, said second barrier having a chain enclosure also enclosing a surface region of said fluid subphase outside of said first and second trough sections;
- a movable barrier in said trough for forming a partial border of said first and second trough sections whereby said first and second barrier and said movable barrier together with the wall of said trough isolate said first and second trough sections from each other;
- an endless chain supported on sprockets above said trough adjacent to said chain enclosure and extending into said second barrier;
- means for driving said sprockets to move said chain through said chain enclosure within said second barrier and through the enclosure containing said fluid subphase within said chain enclosure;

support means connected to said chain for movement with said chain through said chain enclosure, through the fluid subphase within said chain enclosure, and through said surface region of said first and second trough sections, said support means supporting a portion of a substrate and moving said portion of said substrate through said first and second trough sections into contact with said at least one molecular layer in each of said trough sections and the fluid subphase in said enclosure and said second barrier including a movable partition supported at the level of said fluid subphase in the chain enclosure forming a barrier with relation to said first and second trough sections adapted to be moved away from said chain enclosure by said support means as said support means moves through said chain enclosure.

22. In an apparatus for depositing one or more molecular layers on a substrate, said apparatus comprising:
a trough having a wall and a chamber within said wall adapted to receive a fluid subphase and a first and second trough section each adapted to receive at least one molecular layer floating on the surface of said fluid subphase in said chamber;
a first barrier in said trough fixedly located at the surface of said fluid subphase and forming a partial border to isolate said first and second trough sections;
a second barrier in said trough adjoining said first barrier supported at the surface of said fluid subphase forming a partial border with said first barrier to isolate said first and second trough sections, said second barrier having a chain enclosure also enclosing a surface region of said fluid subphase outside of said first and second trough sections;
a movable barrier in said trough for forming a partial border of said first and second trough sections whereby said first and second barrier and said movable barrier together with the wall of said trough isolate said first and second trough sections from each other;
an endless chain supported on sprockets above said trough adjacent to said enclosure and extending into said second barrier;
means for driving said sprockets to move said chain through said chain enclosure within said second barrier and through the enclosure containing said fluid subphase within said chain enclosure;
support means connected to said chain for movement with said chain through said chain enclosure, through the fluid subphase within said chain enclosure, and through said surface region of said first and second trough sections, said support means supporting a portion of a substrate and moving said portion of said substrate through said first and second trough sections into contact with said at least one molecular layer in each of said trough sections and the fluid subphase in said enclosure; and said second barrier including a resilient strip supported at the level of said fluid subphase in the chain enclosure forming a barrier with relation to said first and second trough sections adapted to be moved away from said chain enclosure by said support means as said support means moves through said chain enclosure.

* * * * *